United States Patent

Green

(10) Patent No.: US 6,798,052 B2
(45) Date of Patent: Sep. 28, 2004

(54) FEXIBLE ELECTRONIC DEVICE

(75) Inventor: Peter W. Green, Reigate (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 82 days.

(21) Appl. No.: 10/008,337

(22) Filed: Nov. 8, 2001

(65) Prior Publication Data

US 2002/0068389 A1 Jun. 6, 2002

(30) Foreign Application Priority Data

Dec. 1, 2000 (GB) .............................................. 0029312

(51) Int. Cl.[7] .............................................. H01L 23/02
(52) U.S. Cl. ...................... 257/679; 361/749; 361/752; 361/764
(58) Field of Search .................... 257/679; 361/749, 361/752, 764

(56) References Cited

U.S. PATENT DOCUMENTS

| | | | | |
|---|---|---|---|---|
| 4,415,403 A | | 11/1983 | Bakewell ...................... 156/634 |
| 4,605,471 A | * | 8/1986 | Mitchell ....................... 216/618 |
| 5,179,501 A | * | 1/1993 | Ocken et al. ................. 361/709 |
| 5,216,581 A | * | 6/1993 | Fisher et al. ................. 361/728 |
| 5,627,407 A | | 5/1997 | Suhir et al. .................. 257/701 |
| 5,786,988 A | * | 7/1998 | Harari ......................... 361/749 |
| 5,998,738 A | * | 12/1999 | Li et al. ...................... 174/250 |
| 6,396,709 B1 | * | 5/2002 | Schmich ...................... 361/760 |

FOREIGN PATENT DOCUMENTS

| | | | | |
|---|---|---|---|---|
| DE | 3743163 A1 | * | 6/1989 | ............ H01R/9/09 |
| DE | 19626126 A | | 1/1998 | ............ H01L/25/04 |
| EP | 0065425 A2 | | 11/1982 | ............ H01L/25/16 |
| EP | 1014452 | | 6/2000 | ......... H01L/29/786 |
| WO | WO0046854 | | 8/2000 | ............ H01L/27/00 |
| WO | WO0106563 | | 1/2001 | ............ H01L/27/04 |

OTHER PUBLICATIONS

"Low Temperature PolySi TFTs on Plastic Substrate", S. Utsunomiya et al, SID 00 Digest, pp. 916–919.

* cited by examiner

*Primary Examiner*—Amir Zarabian
*Assistant Examiner*—Jeff Vockrodt

(57) ABSTRACT

An electronic device (38) for mounting on a curved or flexible support (42) and a method for fabrication of the same. The electronic device comprises a layer (2) of rigid material having electronic components on its upper surface. Weakened regions (6) of the rigid layer (2) define contiguous portions of the rigid layer, and flexible connectors (16) extend between components on different portions. The rigid layer (2) can be fractured along the weakened regions (6) to afford flexibility.

11 Claims, 4 Drawing Sheets

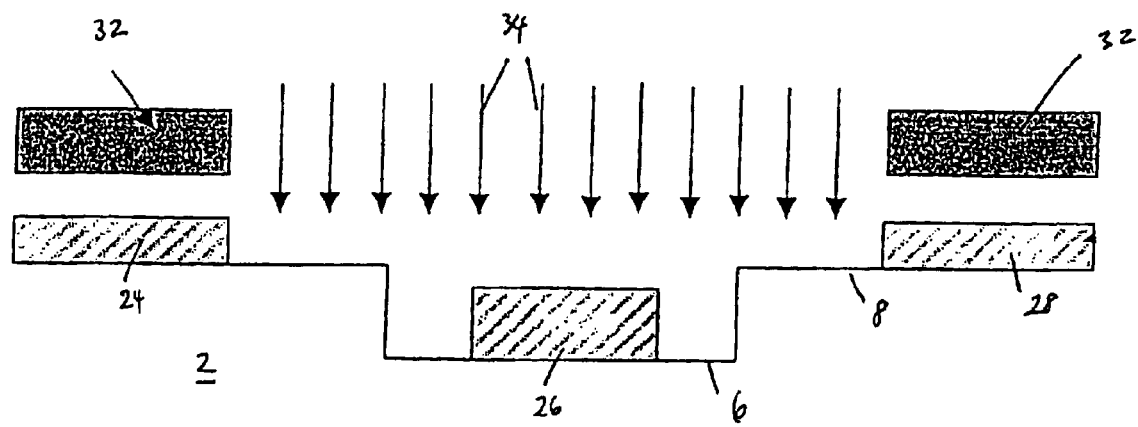
fig.3.A
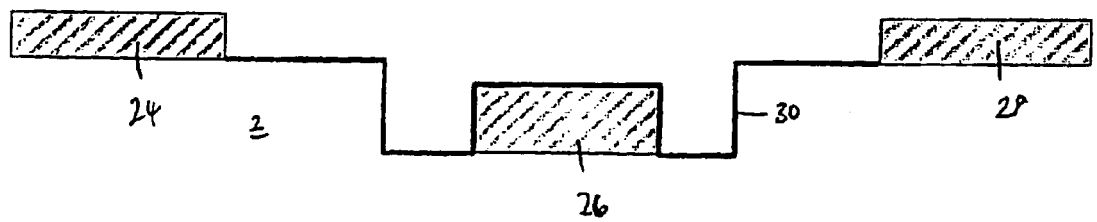
fig.3.B
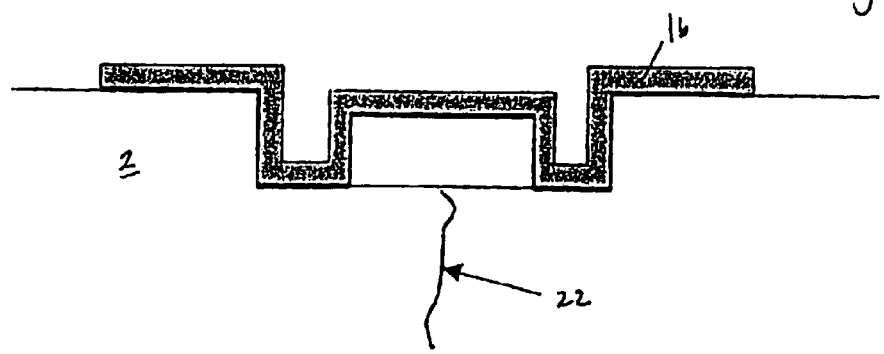
fig.3.C

FEXIBLE ELECTRONIC DEVICE

The present invention relates to a flexible electronic device for mounting on a curved or flexible support and a method for fabrication of the same.

The ability to fabricate flexible electronic devices is becoming increasingly desirable owing to the trend of incorporating electronics in a growing variety of applications. For example, these devices may be employed in "smartcards", that is, credit card sized pieces of plastic including microcontrollers and secure memory.

Large area electronics (LAE) made on flexible plastic substrates have been found to suffer from a number of problems. These include low thermal budgets, poor quality devices, cracking and poor adhesion of layers in the semiconductor devices, take up of water, and poor layer to layer alignment due to expansion and contraction of the plastic substrate.

WO-A-00/46854 describes a technique for producing flexible active matrix displays. Shaped blocks carrying circuit elements are deposited in a slurry onto a flexible substrate which includes complementary recesses. The blocks drop into respective recesses and are then electrically coupled together to form an active matrix.

In a process disclosed in EP-A-1014452, thin film devices are formed on a separation layer which is provided on a substrate. Hydrogen ions are implanted into the separation layer. The separation layer is then parted from the substrate by irradiating the layer with laser light, this process being accelerated by the effects of the prior implantation step. The devices can then be transferred to another substrate. A large-scale active matrix substrate may be formed by the transfer of a plurality of smaller units that have been fabricated separately on other substrates.

An object of the present invention is to provide an improved method of forming an electronic device which is able to flex and an improved flexible electronic device.

The present invention provides a method of fabricating an electronic device comprising the steps of:

(a) forming a predetermined pattern of weakened regions in a layer of rigid material which define contiguous portions of the rigid layer;

(b) providing electronic components on the rigid layer; and (c) forming flexible connectors which extend between components on different portions.

According to the method, the components and connectors are conveniently formed on a rigid layer and the weakened regions ensure that subsequent flexing of the device divides the rigid layer in a predetermined manner. The flexible connectors extend across the weakened regions so that the connections are maintained once the rigid layer has been divided along the weakened regions, allowing further flexing of the device without affecting the device's operation. Where the weakened regions are provided on the opposite surface of the rigid layer to the components and connectors, it may be preferable to carry out step (a) after step (b) and/or step (c). The rigid layer is then in a more robust form during the process of fabricating the components and/or connectors.

The method enables a circuit of substantial area to be transferred in toto to a flexible substrate and then to be fractured in a controlled manner so that the combination is flexible. The rigid layer may be fractured in the finished device, or alternatively, the breakage may occur during use of the device.

The invention further provides a method of fabricating an electronic device comprising the steps of:

(a) providing electronic components on a rigid layer;

(b) forming flexible connectors which extend between components on different contiguous portions of the rigid layer; and (c) dividing the rigid layer into the contiguous portions.

The invention combines the handling advantages of fabricating electronic components and connectors on a more robust, brittle material with the ability to flex the device after the components and connectors have been formed. In a preferred embodiment, the method includes the step of mounting the rigid layer over a flexible substrate. The flexible substrate may provide support to the rigid layer once it has been divided, without preventing flexing of the device.

The method is applicable to the formation of large area electronic (LAE) devices on glass or other rigid materials, or the production of integrated circuits on silicon, for example.

The present invention also provides an electronic device comprising a layer of rigid material having electronic components thereon, contiguous portions of the rigid layer being defined by weakened regions of the rigid layer, and flexible connectors extending between components on different portions.

The invention additionally provides such a device in which the rigid layer has been divided along one or more of the weakened regions such that the device is flexible. The weakened regions may comprise grooves in one or both faces of the rigid layer.

According to another aspect, the invention provides an electronic device comprising a layer of rigid material having electronic components thereon, and flexible connectors extending between components on different contiguous portions of the rigid layer, the rigid layer being divided into the contiguous portions such that the device is flexible.

Thus, the electronic device is provided with the contiguous portions already separated, rather than being joined by weakened regions. This may be appropriate where the device is sufficiently robust in divided form for the following handling thereof. The connectors alone may be secure and strong enough to hold the contiguous portions together until the device is mounted on a substrate.

The rigid layer preferably comprises a brittle material such as glass or silicon, whilst the flexible layer may comprise plastic, for example.

The weakened regions may be formed by etching or sandblasting the rigid layer, or using a diamond circular saw blade. Alternatively, they may be formed by scribing the rigid layer, using a diamond tipped cutter or a diamond or carbide edged wheel for example, or by using a laser to ablate a fine groove or slot. The weakened regions may comprise grooves or slots which extend part-way through the layer from one or both faces. In other embodiments, they may comprise slots or perforations that pass completely through the rigid layer.

In further preferred embodiments, the weakened regions may comprise fine grooves or slots formed in the base of relatively wide grooves. The greater width and depth of a wider groove may reduce the separation occurring at the opposing end of the fracture in the rigid layer, when it is flexed such that the angle defined by the rigid layer surfaces adjacent to the groove is reduced. Also, the depth of the wider groove may result in the rigid layer fracturing more easily. The fine groove ensures that the location of the fracture at the weakened region is precisely defined.

The weakened regions are preferably linear, that is they extend along straight and/or curved lines, and also preferably have a width substantially less than their length, so that breakage occurs in a controlled manner along their length.

The weakened regions may be created before or after the electronic components have been fabricated on the rigid layer. The contiguous portions defined by the weakened regions should be sufficiently small that further breakage of the rigid layer beyond the fracture of the weakened regions does not occur during normal use of the device.

The rigid layer may be divided into contiguous portions by using a laser or other energy beam to locally heat the layer, followed by a rapid cooling or "quenching" process using an air jet or liquid coolant for example. The stress induced by this process may cleanly fracture the layer without the need to flex it. In other cases, for example with a relatively thick layer, such a process may merely weaken the layer in predetermined regions, enabling it to be fractured by subsequent flexing.

The connectors may for example be formed in step (d) by electroplating metal onto the rigid layer. This may include the step of depositing a seed layer prior to electroplating the metal connectors. Areas of photoresist may be defined over the rigid layer prior to electroplating the metal, such that portions of the connectors form bridges over the photoresist, and the photoresist is subsequently removed. The resulting connector is therefore able to flex, thereby maintaining electrical connection of components on different portions despite flexing of the device. Each connector may comprise a single flexible bridge portion that extends over the location where the weakened portion of rigid layer is to fracture, or it may comprise several bridges in a concertina-like structure.

An embodiment of the invention will now be described by way of example and with reference to the accompanying schematic drawings, wherein:

FIGS. 1A to D show partial cross-sectional side views of steps in the fabrication of a flexible device according to an embodiment of the invention;

FIGS. 2A to D show partial cross-sectional side views of rigid layers showing different ways of fracturing the layer;

FIGS. 3A to C show partial cross-sectional side views of steps in the fabrication of the connectors 16 illustrated in FIGS. 1C and 1D;

Figure 1A:
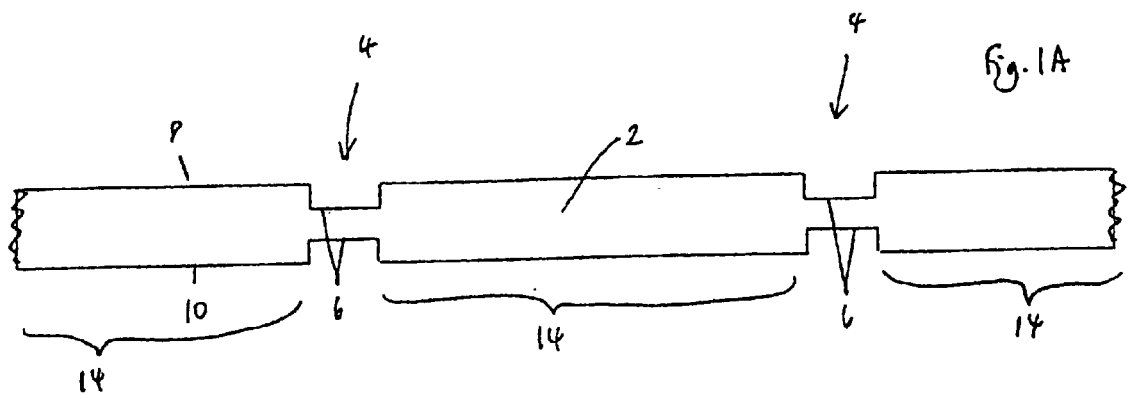

A process for fabricating a flexible device is illustrated in FIGS. 1A to D. FIG. 1A shows a partial transverse cross-section through the plane of a glass layer 2. Two weakened regions 4 are shown, each consisting of a pair of grooves 6 formed in opposing surfaces 8 and 10 of the layer, which extend perpendicularly to the cross-sectional plane. The grooves may be created by an etching or sandblasting process, for example. The grooves define contiguous portions or islands 14 in the layer therebetween.

The grooves 6 shown in FIG. 1 have a rectangular transverse cross-section. However, other cross-sectional geometries may be used, such as a triangular cross-section for example, in which the apex of the triangle defines the line of the eventual fracture in the rigid layer.

Figure 1B:
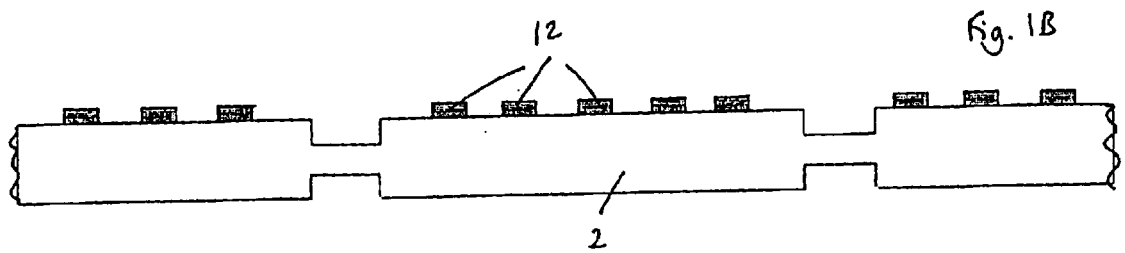
Figure 1C:
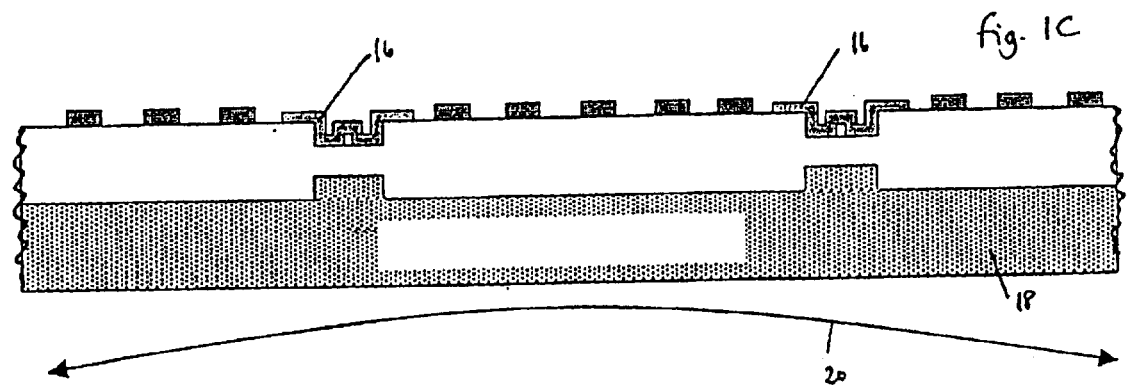

Electronic components 12 are then formed on the upper surface 8 of the layer (FIG. 1B). The components may be provided using known LAE techniques and comprise amorphous, microcrystalline or polycrystalline devices. The process is also applicable to the formation of integrated circuits on silicon, using a layer of silicon in place of the glass layer 2.

Figure 1D:
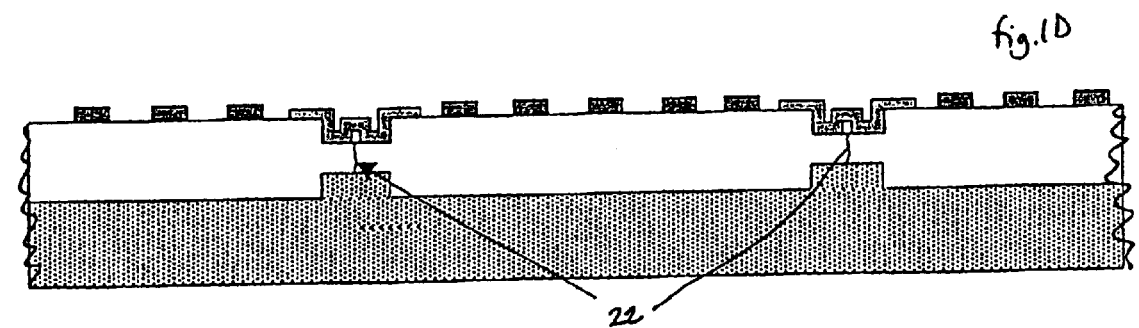

Electrically conductive and flexible connectors 16 (FIG. 1C) are added to make connections between devices on adjacent islands. The formation of these connectors is discussed below in relation to FIG. 2. The glass layer is mounted on a plastic or polymer substrate 18. The assembly is then flexed to fracture the glass layer in a controlled manner, along the weakened regions 4. The arrow 20 illustrates the direction of flexing to fracture the weakened regions 4. It will be appreciated that it may be appropriate to bend the assembly in other directions to fracture other weakened regions which do not run parallel to those shown in FIG. 1. The flexing process produces cracks 22 in the weakened regions, as shown in FIG. 1D. As a result, the islands 14 can move relative to each other, but remain electrically connected via the electroplated bridges 16.

Typically, the glass layer may be around 0.7 mm thick or less. The islands may be about 5 mm by 5 mm. This island size is based on the current maximum crystalline silicon chip size of 25 $mm^2$ used in flexible smartcard technology. This is determined by the extent of flexing that can be withstood before cracking of the integrated circuit chip and/or other types of failure occur. These dimensions may be varied to suit the requirements of particular applications, and the properties of the materials used and the circuitry. It will be appreciated that different materials which may be employed to form the rigid layer 2, which whilst rigid relative to the flexible layer, may have varying degrees of rigidity. The islands should be sufficiently small for further breakage to be avoided during flexing of the device in normal use.

Further methods of fracturing the rigid layer 2 are illustrated in FIGS. 2A to D. It may be preferable to form a relatively fine groove in the surface of the rigid layer compared to that shown in FIG. 1, to define weakened regions. This can be achieved by a scribing process, using a diamond tipped cutter for example. Alternatively, a laser may be used to ablate material from the rigid layer to form a fine groove. In this way, the location of fractures in the rigid layer can be precisely defined.

Figure 2A:
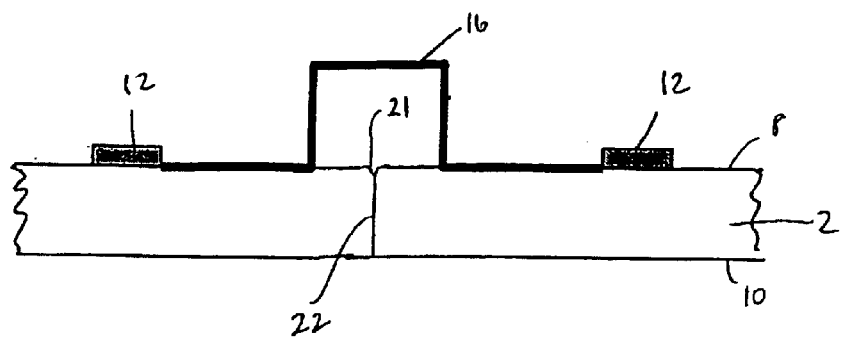

A rigid layer fractured using this type of procedure is shown in FIG. 2A. The location of fracture 22 is defined by forming a fine groove or score line in the upper or lower surface 8, 10 of the rigid layer. Subsequent flexing of the rigid layer then causes the rigid layer to fracture along the length of the fine groove.

Figure 2B:
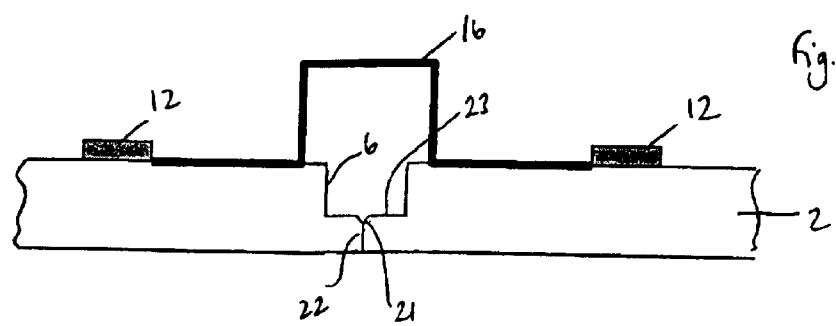
Figure 2C:
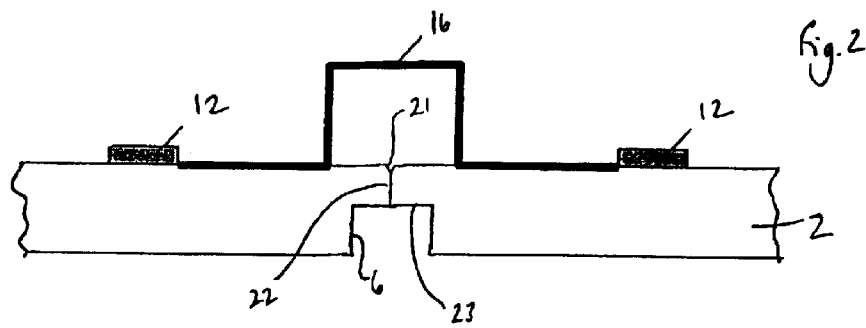
Figure 2D:
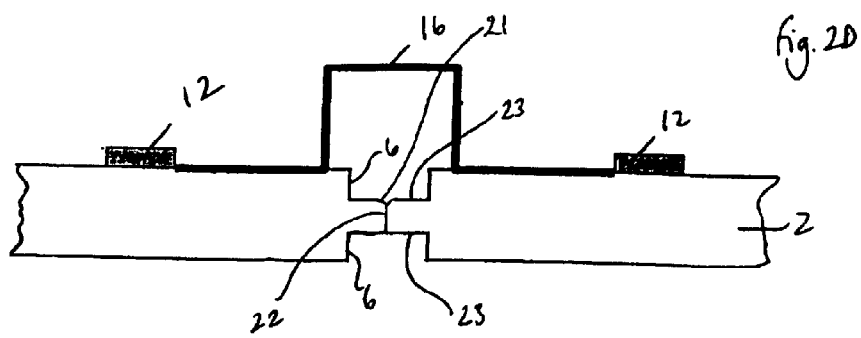

FIGS. 2B to D show further embodiments, in which fine grooves are combined with relatively large grooves 7 to provide greater degrees of flexibility in the fractured rigid layer compared to that shown in FIG. 2A. The relatively large grooves may be formed in the upper surface 8 (FIG. 2B), the lower surface 10 (FIG. 2C), or both upper and lower surfaces 8, 10 of the rigid layer (FIG. 2D). A fine groove is used to define the location of the eventual fracture 22 in the base 23 of the relatively large groove 6.

A fine groove formed by a scribing process may typically be around 2.5 to 7 $\mu$m deep. The scribing process may cause lateral damage either side of the scribe line, with the width of the resulting groove including this damage being around 100 to 200 $\mu$m.

The dimensions of the relatively wide grooves referred to above may be selected according to a number of factors. The wide groove may be used to guide the scribing tool, in which case it should be wide enough relative to its depth to accommodate the angle of the scribing tool. The wide groove depth may be selected so as to determine the amount of flexing required to fracture the rigid layer. Its width should preferably be sufficient to avoid contact between opposing walls of the groove when the rigid layer is flexed. Typically, the width and depth of the relatively wide groove may be a half to a third of the thickness of the rigid layer, or less.

It will be appreciated that in each embodiment shown in FIG. 2, where the upper surface 8 is scribed, this step should be carried out prior to formation of the connector 16, whilst scribing of the lower surface 10 may be executed at any stage prior to the rigid layer being mounted on another substrate.

An example of a process for forming the flexible connectors will now be described with reference to FIG. 3. FIG. 3A shows an enlarged cross-sectional view of a weakened portion or groove 6 in the upper surface 8 of a glass layer 2. Photoresist is deposited onto the surface 8 and then patterned such that three blocks 24, 26 and 28 are formed in the region of the groove 6. Block 26 is located at the base of the groove, whilst blocks 24 and 28 are close to respective edges of the groove. A thin electroplating seed layer 30 (shown in FIG. 3B) is then deposited in the direction of arrows 34 using, for example, a shadow mask 32, such that the layer extends over block 26 and to the edges of blocks 24 and 28. The seed layer 30 may consist of copper over chromium, for example.

The connector 16 is then electroplated over the seed layer 30. Nickel or copper may be used to form the connectors. The photoresist blocks 24, 26 and 28 are subsequently removed to leave the finished connector (FIG. 3C). As discussed above in relation to FIG. 1, flexing of the glass layer forms a crack 22 therein below the connector. As can be seen, the presence of the block 26 results in a concertina-like structure in the connector, which extends as a bridge over the crack. The connector is able to accommodate the flexing of the glass layer required for controlled fracture of the glass layer without breaking.

Figure 4:
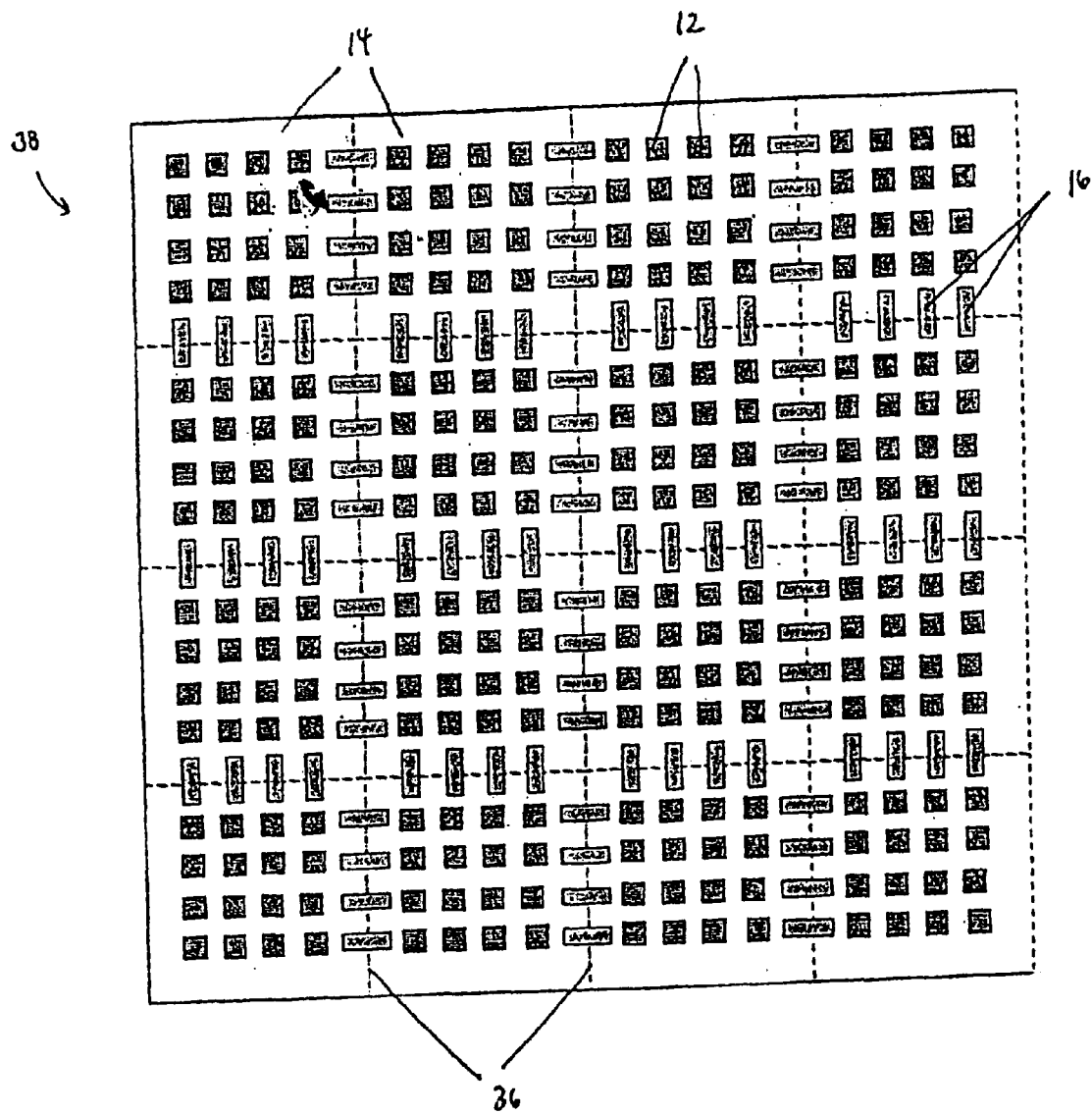
FIG. 4 shows a plan view of the flexible device illustrated in FIG. 1D.

FIG. 4 shows a schematic plan view of a flexible electronic device 38 formed using the techniques described above. The device comprises a plurality of contiguous islands 14, each supporting several electronic components 12, and interconnected by connectors 16. Dashed lines 36 indicate the borders of the islands 14.

Figure 5:
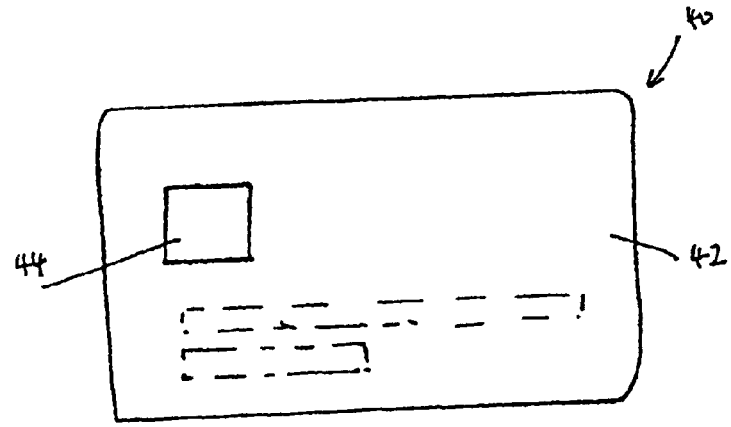
FIG. 5 shows a smartcard having a flexible electronic device mounted thereon.

Electronic devices of the invention may be used in smartcards. A smartcard 40 is illustrated in FIG. 5. It comprises a flexible card of plastic 42 having a component 44 mounted thereon which includes an embodiment of a flexible electronic device as described herein. As well as providing memory, these cards may include other features such as biometric testing functions (for example fingerprint sensors) for increased security, keyboards, displays, speakers, microphones, and the like. The invention enables the total chip area to be increased from the presently adopted area of about 25 mm$^2$. External readers and/or power sources may for example connect to the device via electrical contact surfaces (not shown) included in the component 44.

These devices may also be used to make flexible displays (for example, pLED (light emitting polymer displays) or liquid crystal displays), incorporated into clothing, or mounted on any curved or flexible substrate such as computer mice, car dashboards, lamp shades, toys and the like.

From reading the present disclosure, other variations and modifications will be apparent to persons skilled in the art. Such variations and modifications may involve equivalent and other features which are already known in the design, manufacture and use of electronic devices, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present Application or of any further Application derived therefrom.

What is claimed is:

1. An electronic device comprising a layer of rigid material having electronic components mounted directly thereon, contiguous portions of the rigid layer being defined by weakened regions of the rigid layer, and flexible connectors extending between components on different carbons, wherein the rigid layer is mounted over a flexible substrate.

2. The device of claim 1 wherein the weakened regions comprise grooves in one or both faces of the rigid layer.

3. The device of claim 1 wherein the connectors comprise electroplated metal.

4. The device of claim 1 wherein the connectors comprise a bridge-like portion.

5. An article having the electronic device of claim 1 mounted thereon.

6. An electronic device comprising a layer of rigid material having electronic components mounted directly thereon, and flexible connectors extending between components on different contiguous portions of the rigid layer, the rigid layer being divided into the contiguous portions such that the device is flexible, wherein the rigid layer is mounted over a flexible substrate.

7. The device of claim 6 wherein the rigid layer has been divided into the contiguous portions along weakened regions of the rigid layer.

8. The device of claim 7 wherein the weakened regions comprise grooves in one or both faces of the rigid layer.

9. The device of claim 6 wherein the connectors comprise electroplated metal.

10. The device of claim 6 wherein the connectors comprise a bridge-like portion.

11. An article having the electronic device of claim 1 mounted thereon.

* * * * *